(12) United States Patent
Kwok et al.

(10) Patent No.: US 6,429,087 B2
(45) Date of Patent: *Aug. 6, 2002

(54) METHODS OF FORMING CAPACITORS

(75) Inventors: Siang Ping Kwok, Dallas; William F. Richardson, Richardson, both of TX (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 26 days.

(21) Appl. No.: 09/386,537

(22) Filed: Aug. 30, 1999

(51) Int. Cl.$^7$ ............................................... H01L 21/20
(52) U.S. Cl. ....................................... 438/381; 438/239
(58) Field of Search ................................ 438/253, 254, 438/255, 329, 381, 396, 397, 398, 399, 256, 238, 239, 240

(56) References Cited

U.S. PATENT DOCUMENTS

| | | | |
|---|---|---|---|
| 5,391,511 A | | 2/1995 | Doan et al. |
| 5,597,756 A | * | 1/1997 | Fazan et al. ................. 438/964 |
| 5,604,147 A | * | 2/1997 | Fischer et al. |
| 5,821,141 A | * | 10/1998 | Huang ......................... 438/253 |
| 6,046,093 A | * | 4/2000 | DeBoer et al. ............. 438/398 |
| 6,080,620 A | * | 6/2000 | Jeng ............................ 438/253 |
| 6,107,139 A | * | 8/2000 | Tu et al. ..................... 438/254 |
| 6,214,727 B1 | | 1/2001 | Parekh |

OTHER PUBLICATIONS

U.S. application No. 08/798,251, Parekh, filed Feb. 11, 1997.

* cited by examiner

Primary Examiner—David Nelms
Assistant Examiner—David Nhu
(74) Attorney, Agent, or Firm—Wells St. John P.S.

(57) ABSTRACT

In one aspect, the invention encompasses a method of forming a capacitor. A mass is formed over an electrical node. An opening is formed within the mass. The opening has a lower portion proximate the node and an upper portion above the lower portion. The lower portion is wider than the upper portion. A first conductive layer is formed within the opening and along a periphery of the opening. After the first conductive layer is formed, a portion of the mass is removed from beside the upper portion of the opening while another portion of the mass is left beside the lower portion of the opening. A dielectric material is formed over the first conductive layer, and a second conductive layer is formed over the dielectric material. The second conductive layer is separated from the first conductive layer by the dielectric material. In another aspect, the invention encompasses a capacitor construction.

16 Claims, 7 Drawing Sheets

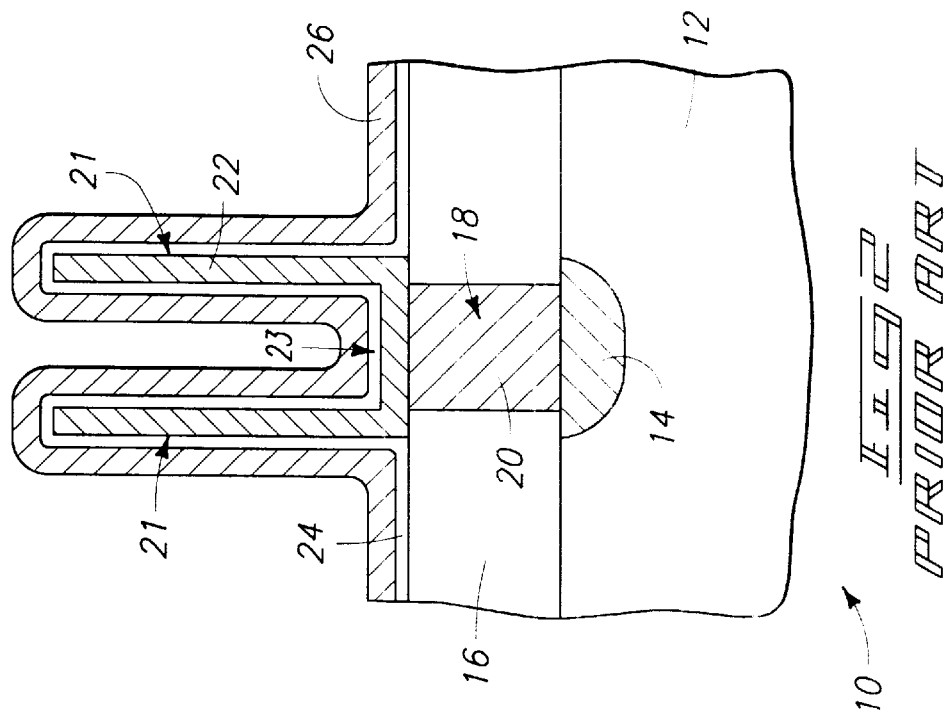
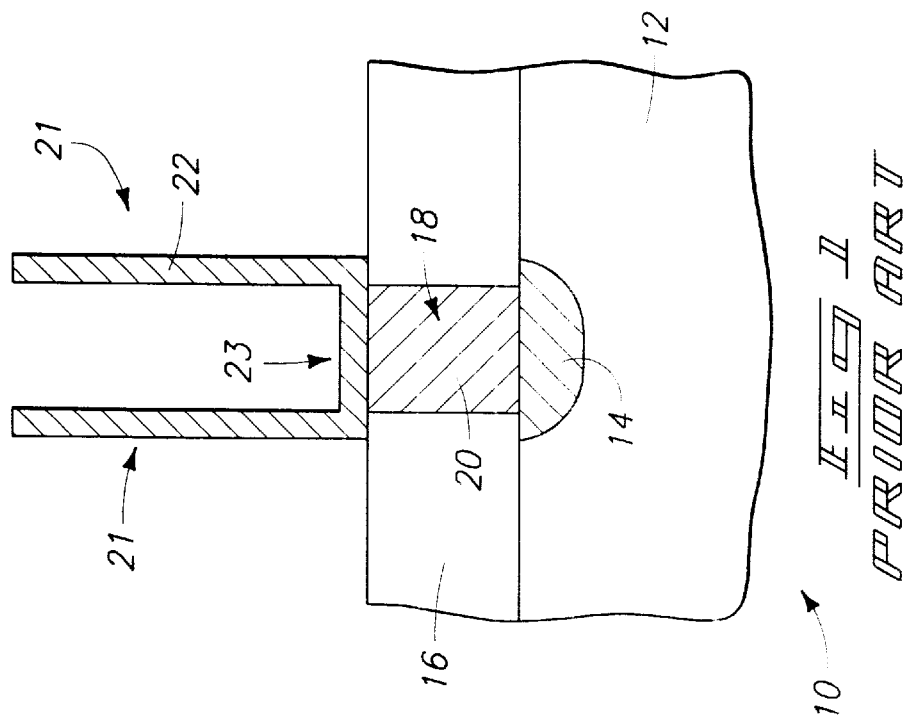

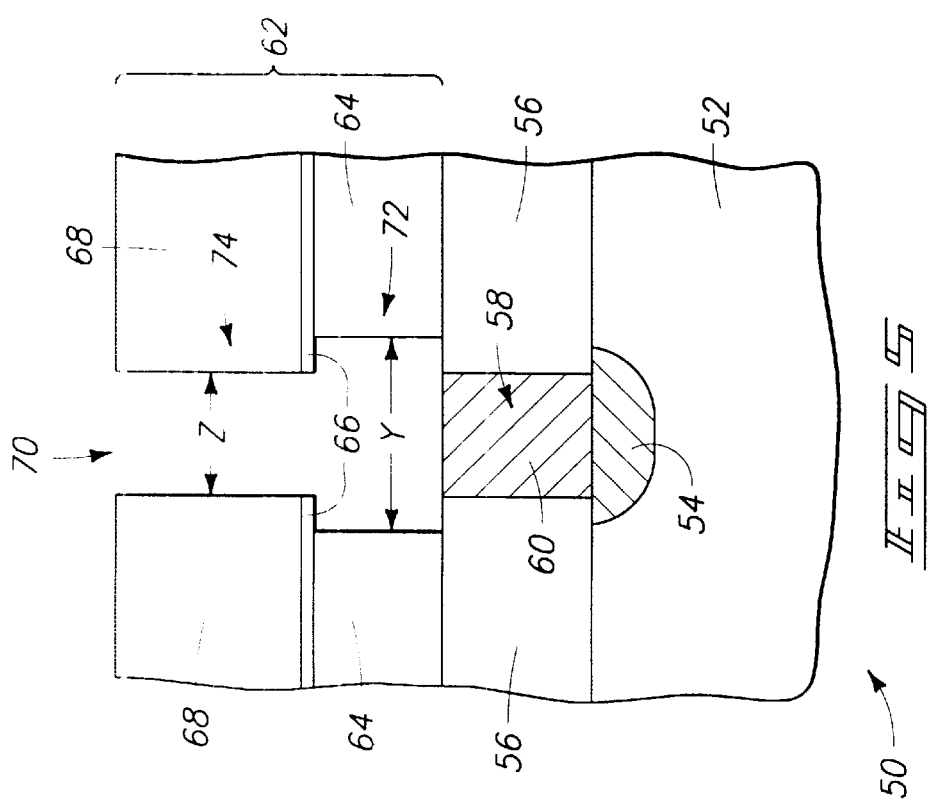
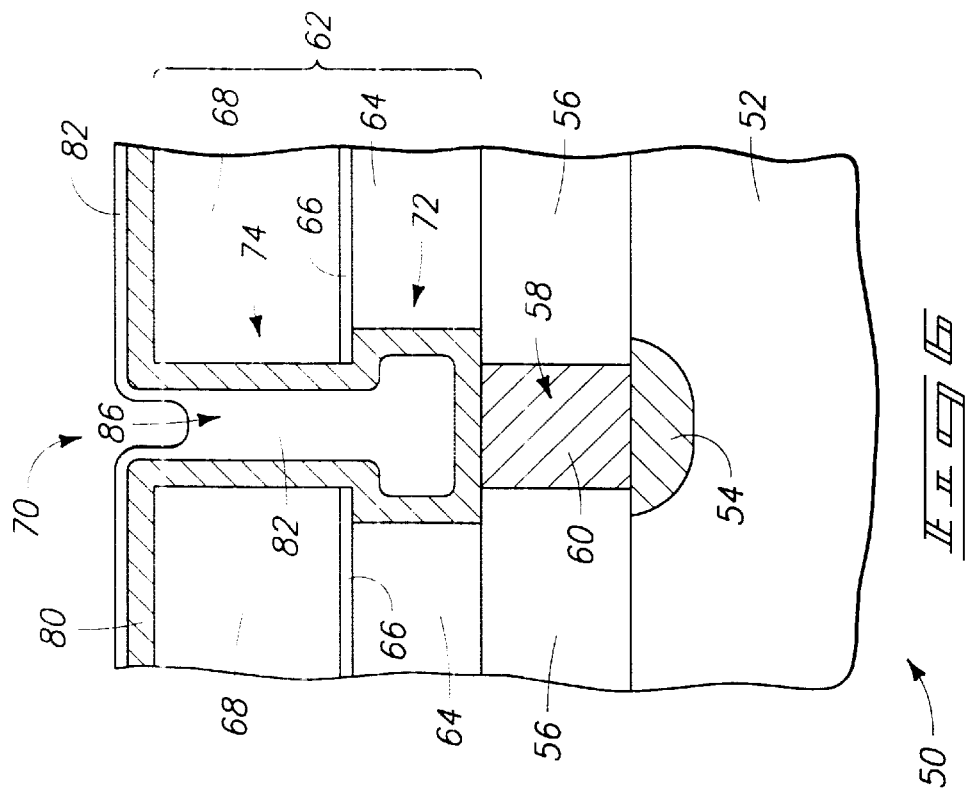

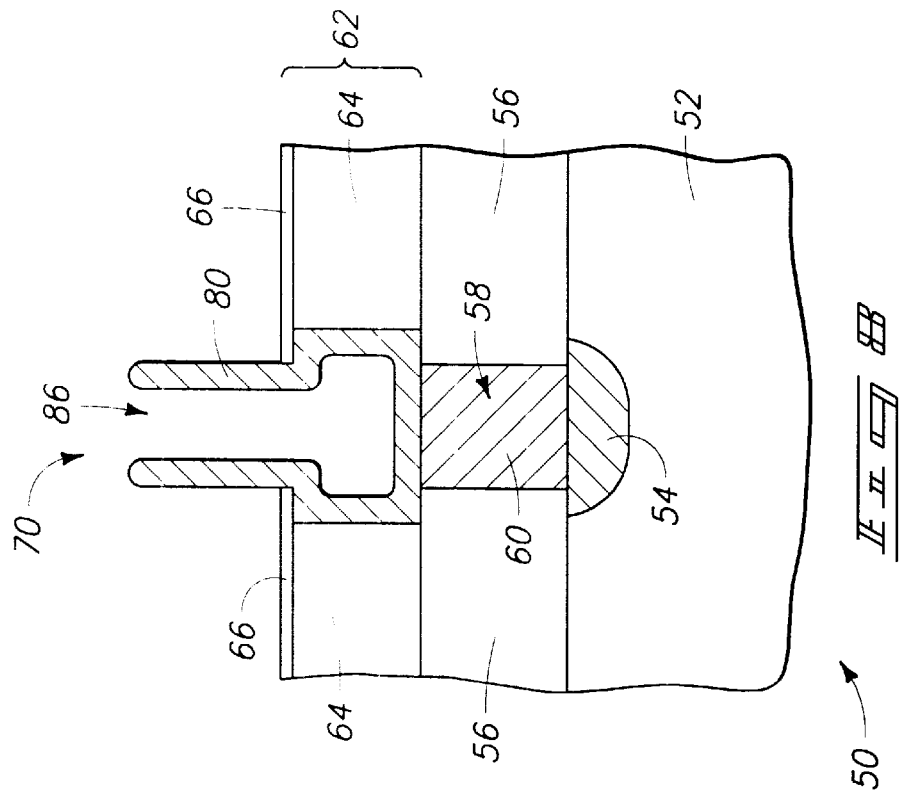
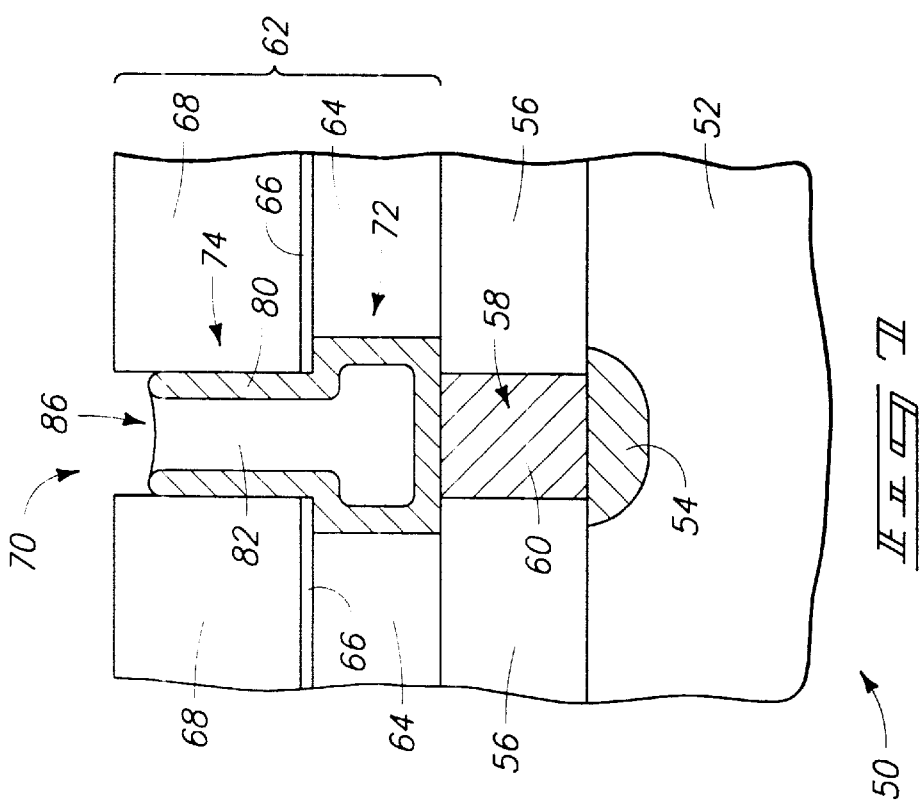

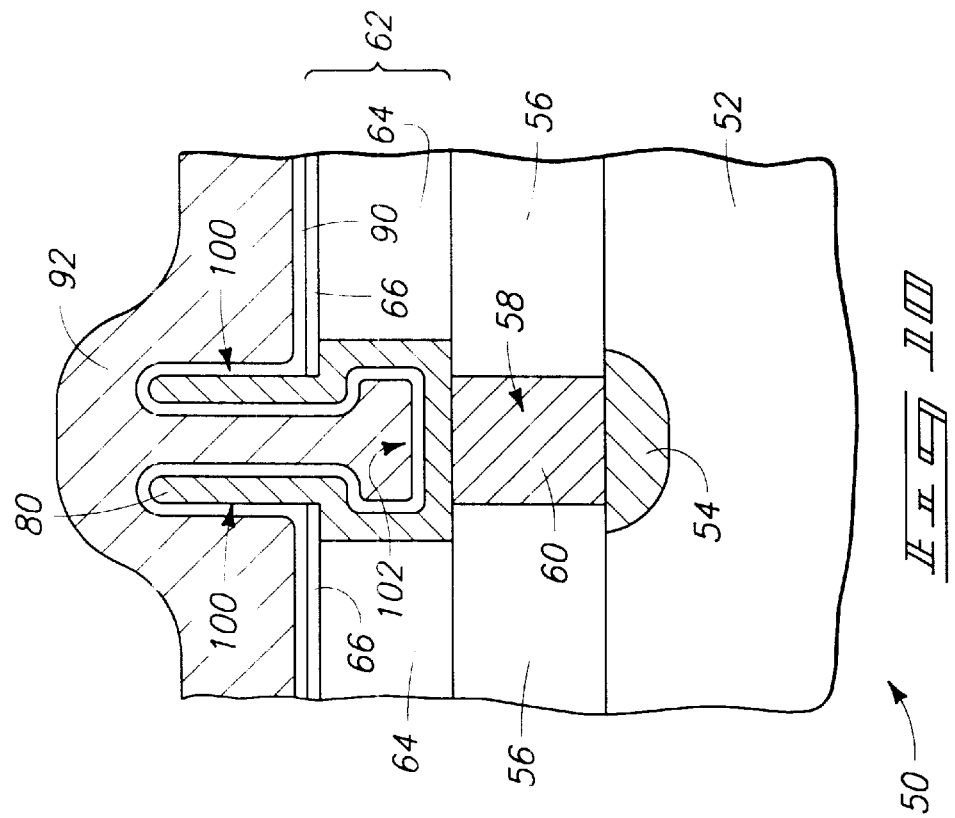
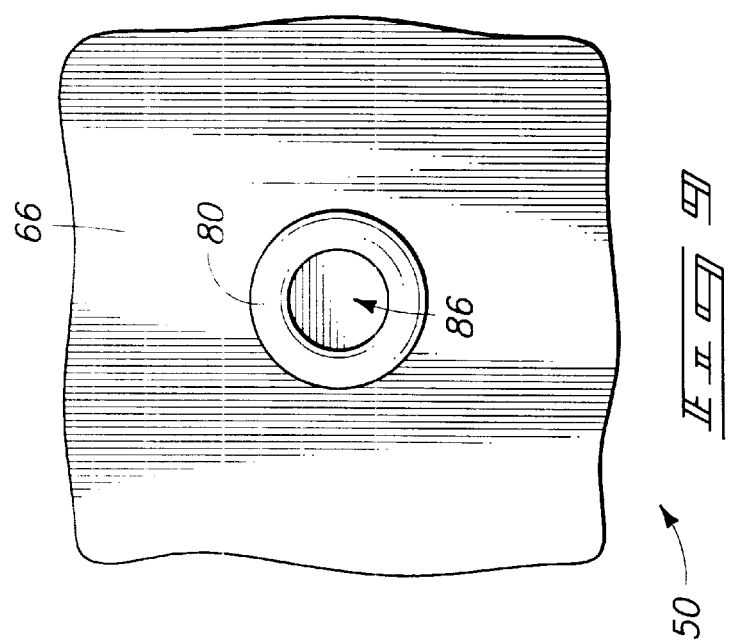

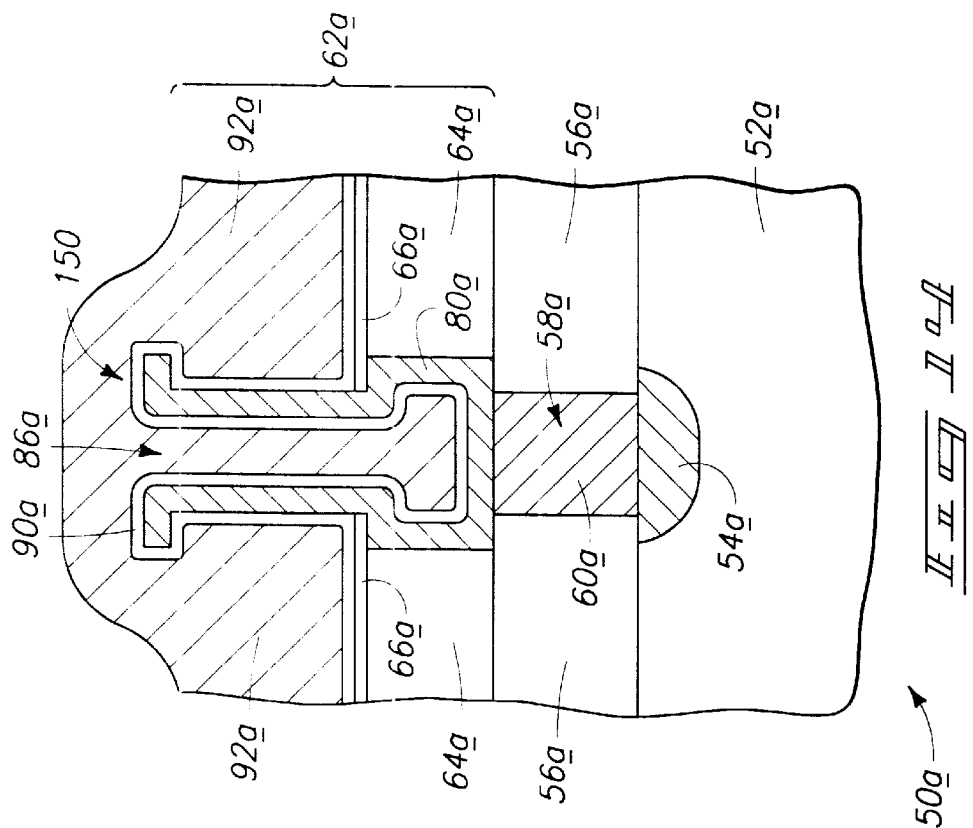
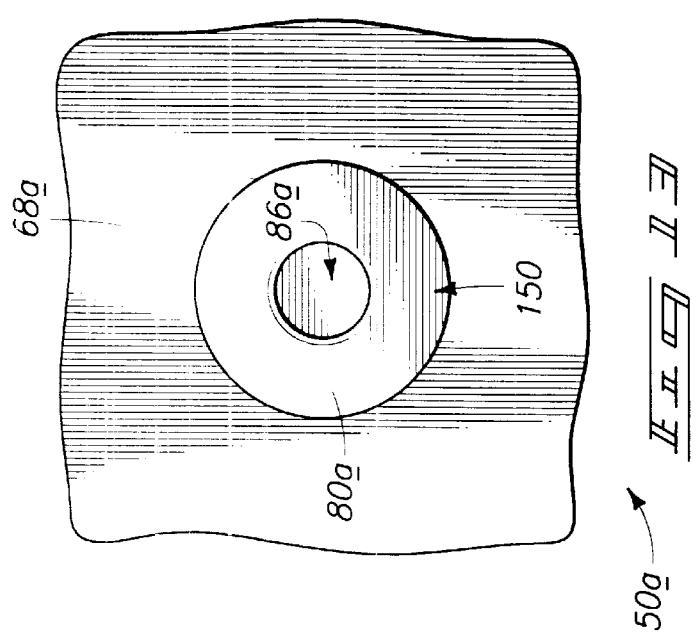

METHODS OF FORMING CAPACITORS

TECHNICAL FIELD

The invention pertains to capacitor constructions and methods of forming capacitors. In a particular aspect, the invention pertains to crown capacitor constructions.

BACKGROUND OF THE INVENTION

A method of forming a prior art crown capacitor construction is described with reference to FIGS. 1 and 2. Referring to FIG. 1, a semiconductive material wafer fragment 10 comprises a substrate 12 which supports an electrical node 14. Substrate 12 can comprise, for example, lightly doped monocrystalline silicon. Electrical node 14 can comprise, for example, a conductively-doped diffusion region provided within a monocrystalline silicon substrate 12.

To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An insulative layer 16 is formed over substrate 12. Insulative layer 16 can comprise, for example, silicon dioxide, silicon nitride, borophosphosilicate glass (BPSG), or phosphosilicate glass (PSG). Layer 16 has an opening 18 extending therethrough to electrical node 14. A conductive plug 20 is provided within opening 18. Conductive plug 20 can comprise, for example, a metal, or conductively doped polysilicon.

A container-shaped storage node 22 is provided over insulative layer 16, and over conductive plug 18. Storage node 22 is in electrical connection with electrical node 14 through conductive plug 18. Container-shaped storage node 22 can also be referred to as a crown-shaped storage node. Storage node 22 comprises upwardly extending members 21, and a horizontally extending member 23.

Referring to FIG. 2, a dielectric material 24 is provided over storage node 22, and a second capacitor electrode layer 26 is provided over dielectric material 24. Dielectric material 24 can comprise, for example, a combination of silicon dioxide and silicon nitride. Alternatively, dielectric material 24 can comprise tantalum pentoxide. Second capacitor electrode 26 can comprise, for example, a metal, conductively doped polysilicon, or a metal-comprising compound, such as, for example, titanium nitride.

Storage node 22, dielectric material 24, and second capacitor electrode 26, together define a crown capacitor.

A problem with the processing described above with reference to FIGS. 1 and 2 is that the upwardly extending members 21 of storage node 22 can be easily broken during subsequent processing. It would therefore be desirable to develop alternative methods of forming crown capacitors.

SUMMARY OF THE INVENTION

In one aspect, the invention encompasses a method of forming a capacitor. A mass is formed over an electrical node. An opening is formed within the mass. The opening has a lower portion proximate the node and an upper portion above the lower portion. The lower portion is wider than the upper portion. A first conductive layer is formed within the opening and along a periphery of the opening. After the first conductive layer is formed, a portion of the mass is removed from beside the upper portion of the opening while another portion of the mass is left beside the lower portion of the opening. A dielectric material is formed over the first conductive layer, and a second conductive layer is formed over the dielectric material. The second conductive layer is separated from the first conductive layer by the dielectric material.

In another aspect, the invention encompasses a capacitor construction. Such construction includes an insulative mass over an electrical node, and an opening extending through the mass to the electrical node. The construction further includes a storage node layer within the opening. The storage node layer extends around a periphery of the opening and protrudes above the insulative mass. The storage node layer defines a container shape having a void extending therein. The void has a lower portion within the opening and an upper portion above the opening. The upper portion of the void is narrower than the lower portion. Additionally, the construction includes a dielectric material within the void and partially filling the void, and a second capacitor electrode within the void and separated from the first conductive layer by the dielectric material.

BRIEF DESCRIPTION OF THE DRAWINGS

Preferred embodiments of the invention are described below with reference to the following accompanying drawings.

FIG. 1 is a diagrammatic, cross-sectional view of a semiconductive material wafer fragment shown at a preliminary step of a prior art capacitor-forming process.

FIG. 4 is a view of the FIG. 3 wafer fragment shown at a processing step subsequent to that of FIG. 3.

FIG. 5 is a view of the FIG. 3 wafer fragment shown at a processing step subsequent to that of FIG. 4.

FIG. 6 is a view of the FIG. 3 wafer fragment shown at a processing step subsequent to that of FIG. 5.

FIG. 7 is a view of the FIG. 3 wafer fragment shown at a processing step subsequent to that of FIG. 6.

FIG. 8 is a view of the FIG. 3 wafer fragment shown at a processing step subsequent to that of FIG. 7.

FIG. 9 is a top view of the FIG. 8 wafer fragment.

FIG. 10 is a view of the FIG. 3 wafer fragment shown at a processing step subsequent to that of FIG. 8.

FIG. 13 is a top view of the FIG. 12 wafer fragment.

FIG. 14 is a view of the FIG. 3 wafer fragment shown at a processing step in accordance with the second embodiment and subsequent to that of FIG. 12.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 3:
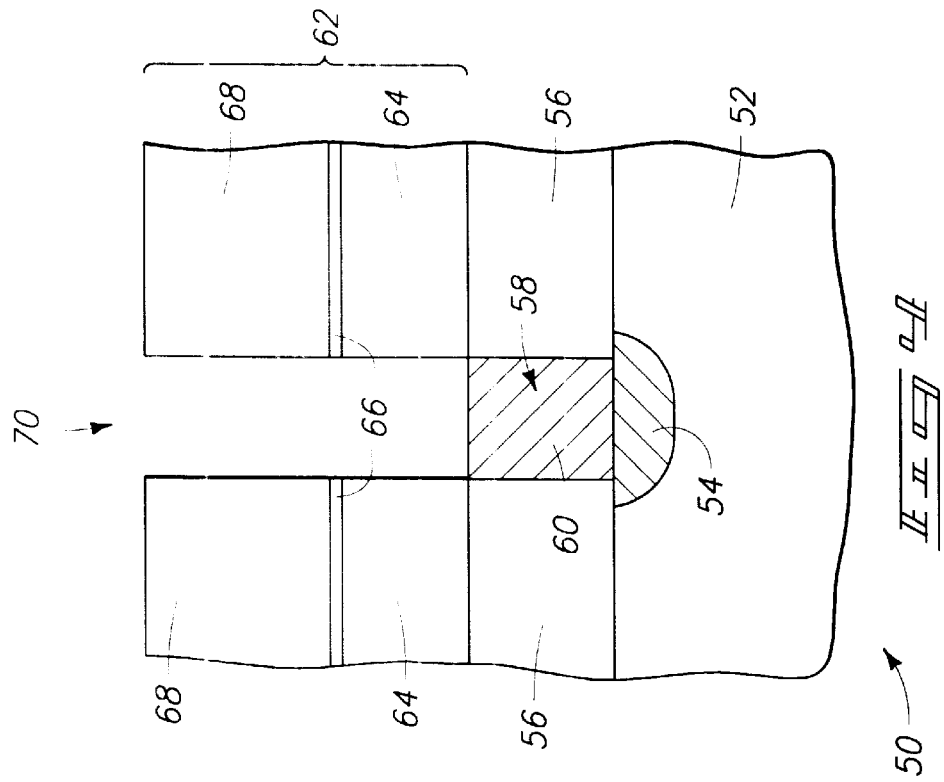
FIG. 3 is a diagrammatic, cross-sectional view of a semiconductive material wafer fragment shown at a preliminary step of a capacitor-forming method encompassed by the present invention.

A first embodiment method of forming a capacitor construction in accordance with the present invention is described with reference to FIGS. 3–10. Referring to FIG. 3, a semiconductive material wafer fragment 50 is shown at a preliminary process step. Wafer fragment 50 comprises a substrate 52 supporting an electrical node 54. Substrate 52 and node 54 can comprise, for example, the constructions described above for substrate 12 and node 14, respectively, of the prior art construction of FIG. 1. Substrate 52 and node 54 can also, of course, comprise alternate constructions.

An insulative material 56 is formed over substrate 52. Insulative material 56 can comprise, for example, materials similar to those described above with reference to insulative layer 16 of the prior art construction of FIG. 1. An opening 58 extends through insulative material 56, and a conductive material 60 is formed within the opening. Conductive material 60 can comprise, for example, constructions similar to those discussed above with reference to conductive plug 20 of the prior art construction of FIG. 1. Plug 60 can also comprise alternate constructions. It is noted that although the term "electrical node" was 4 utilized above in describing node 54, plug 60 can also be referred to as an "electrical node".

A mass 62 is formed over insulative layer 56 and electrical node 60. In the shown embodiment, mass 62 comprises the three distinct layers 64, 66 and 68. Layers 64, 66 and 68 preferably comprise materials selectively etchable relative to one another. For instance, in one embodiment layer 64 consists essentially of PSG, layer 66 consists essentially of silicon nitride, and layer 68 consists essentially of BPSG. In another embodiment, layer 64 consists essentially of doped silicon dioxide, layer 66 consists essentially of silicon nitride, and layer 68 consists essentially of undoped silicon dioxide. Layers 64 and 66 are preferably electrically insulative. Layers 64, 66 and 68 can be formed to thicknesses of, for example, about 100 nanometers, 10 nanometers and 400 nanometers, respectively.

Referring to FIG. 4, an opening 70 is etched through layers 64, 66 and 68 to expose node 60. Such opening can be formed by, for example, photolithographic processing to form a patterned photoresist mask (not shown) over layer 68, and subsequently utilizing an etchant comprising a halogenated-hydro-carbon and inert gases to etch through layers 64, 66, and 68 in the location of opening 70.

Referring to FIG. 5, the material of layer 64 is etched faster than the materials of layers 66 and 68. Such faster etching can be accomplished for an etch selective for the material of layer 64 relative to the materials of layers 66 and 68. In embodiments wherein the material of layer 64 comprises PSG, and the materials of layer 66 and 68 comprise silicon nitride and BPSG, respectively, the selective etching can be accomplished utilizing hydrofluoric acid. Also, in embodiments in which layer 64 comprises doped silicon dioxide, and layers 66 and 68 comprise silicon nitride and undoped silicon dioxide, respectively, the selective etching can be accomplished utilizing hydrofluoric acid. It is noted that a hydrofluoric acid etch would typically be done prior to formation of a storage node in contact with electrical node 60 (the storage node is described below with reference to FIGS. 6–10), to clean exposed portions of fragment 50 prior to formation of the storage node. Accordingly, the etching with hydrofluoric acid does not add an additional process step beyond the steps generally utilized for capacitor fabrication.

Is After the etching of layer 64, opening 70 comprises two distinct portions, labeled as portions 72 and 74 in FIG. 5. Portion 72 is a lower portion, and portion 74 is an upper portion. Portions 72 and 74 join at a lower edge of layer 66. Lower portion 72 has a width "Y" and upper portion 74 has a width "Z", with "Z" being less than "Y".

Referring to FIG. 6, a first conductive layer 80 is formed over mass 62 and within opening 70. First conductive layer 80 can comprise, for example, conductively doped polysilicon and/or a metal. First conductive layer 80 preferably comprises conductively doped roughened polysilicon, such as, for example, conductively doped hemispherical grain polysilicon. First conductive layer 80 only partially fills opening 70 and defines a void 86 therein.

A masking material 82 is formed over conductive layer 80. Masking material 82 is preferably applied while wafer 50 is spinning, and applied at a viscosity such that material 82 flows into opening 70. Further, material 82 is preferably applied to a thickness such that opening 70 is predominantly filled, but only a very thin amount of material 82 is over mass 62. Material 82 can comprise, for example, 14 photoresist.

Referring to FIG. 7, wafer fragment 50 is subjected to etching conditions which remove the thin layer of masking material 82 from over mass 62, and subsequently remove first conductive layer 80 from over mass 62. During such etching, the portion of masking material 82 within opening 70 protects first conductive layer 80 within opening 70. Accordingly, the etching forms first conductive layer 80 into a container-shape retained within opening 70. The container-shape can also be referred to as a crown-shape.

The methodologies of FIGS. 6 and 7 are but one exemplary method of removing conductive material 80 from over mass 62 while leaving some of conductive material 80 within opening 70, and other methods will be recognized by persons of ordinary skill in the art. For instance, alternative methods of removing conductive material 80 from over mass 62 include chemical-mechanical polishing and resist etch-back.

Referring to FIG. 8, wafer fragment 50 is subjected to conditions which remove masking material 82 from within opening 70. In exemplary embodiments where a mask material 82 comprises photoresist, such conditions can comprise exposure to oxygen and heat sufficient to ash photoresist 82. Also, wafer fragment 50 is subjected to conditions which remove layer 68 from over layer 66. In preferred embodiments wherein layer 68 is selectively etchable relative to layer 66, layer 66 constitutes an etch-stop. In an exemplary embodiment wherein layer 68 comprises undoped silicon oxide and layer 66 comprises silicon nitride, the selective etching of layer 68 relative to layer 66 can be accomplished utilizing hydrofluoric acid. The removal of layer 68 reduces a height of mass 62. The removal of layer 68 increases the surface of the conductive material.

FIG. 9 shows a top view of the fragment 50 of FIG. 8, and shows that conductive material 80 is preferably in a container-shape comprising a circular opening 86 extending therein.

Figure 2:
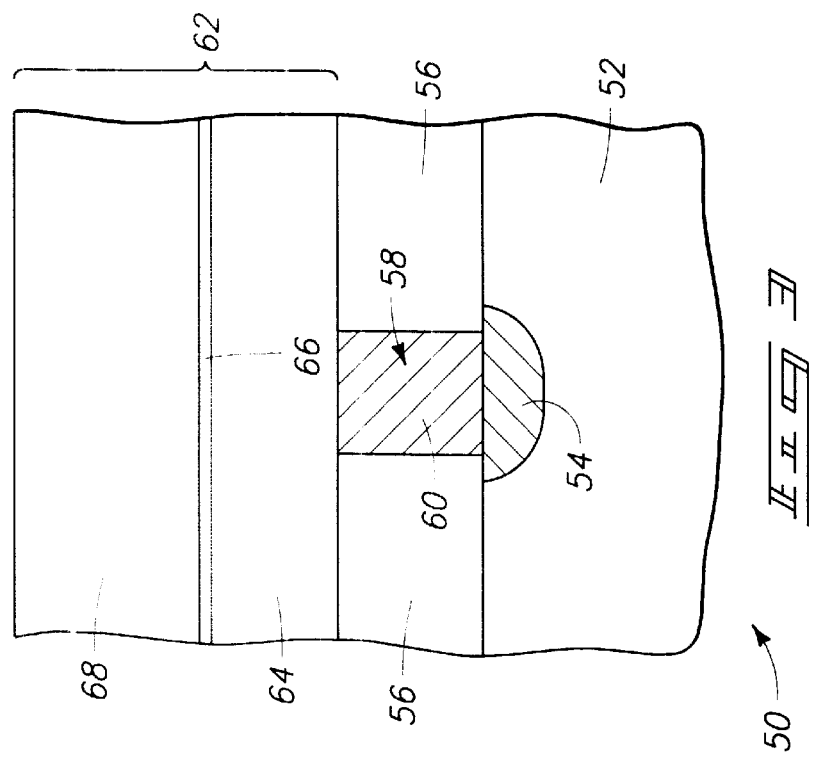
FIG. 2 is a view of the FIG. 1 wafer fragment shown at a prior art processing step subsequent to that of FIG. 1.

Referring to FIG. 10, dielectric material 90, and a second conductive layer 92 are formed over first conductive layer 80 and within void 86. Dielectric material 90 and second conductive material 92 can comprise, for example, materials similar to those discussed above regarding dielectric material 24 and conductive material 26, respectively, of the prior art (FIG. 2). First conductive material 80, dielectric layer 90, and second conductive layer 92 together define a capacitor, with first conductive material 80 corresponding to a storage node of the capacitor and second conductive material 92 corresponding to a second capacitor electrode. Second capacitor electrode 92 is separated from storage node 80 by dielectric layer 90.

In the shown embodiment, a portion of storage node 80 is within mass 62, and a portion extends above mass 62. Accordingly, storage node 80 corresponds to a partially buried storage node. Storage node 80, like prior art storage node 22, comprises upwardly projecting 14 portions (labeled as 100 for storage node 80), and a horizontal portion (labeled as 102 for storage node 80). However, the partially buried nature of capacitor 80 provides structural support for vertically extending portions 100 beyond that provided for vertically extending portions 21 (FIG. 2) of a prior art capacitor construction achieving a same capacitance as the capacitor construction of FIG. 10. Such structural support can increase a mechanical stability of vertically projecting portions 100 relative to vertically projecting portions 21. Also, the partially-buried nature of a storage node of the present invention reduces a non-planarity across an upper surface of wafer fragment 50 in the processing steps of FIGS. 8–10 relative to the non-planarity associated with an upper surface of wafer fragment 50 in prior art processing steps associated with FIGS. 1 and 2. Such reduction in non-planarity can alleviate problems associated with photolithographic processing. Specifically, photolithographic processing becomes increasingly more complicated with increasing non-planarity across an upper surface that is to be patterned.

A second embodiment of the present invention is described with reference to FIGS. 11–14. In referring to FIGS. 11–14, similar numbering will be used as was utilized above in describing the first embodiments of FIGS. 3–10, with the suffix "a" indicating structures associated with FIGS. 11–14.

Figure 11:
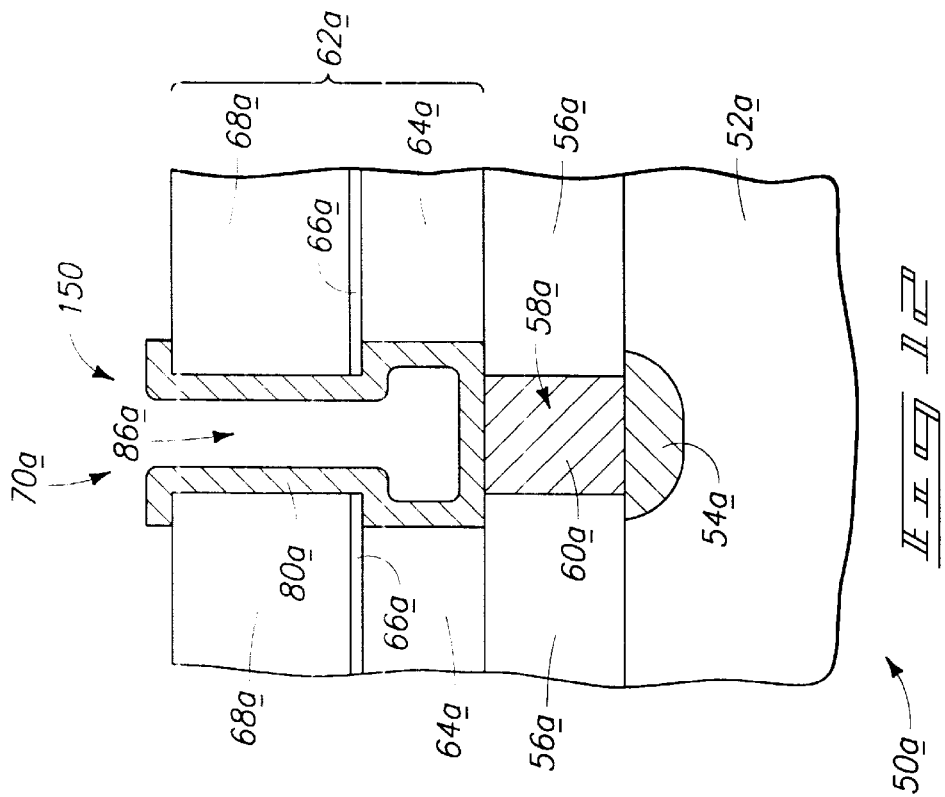
FIG. 11 is a view of the FIG. 3 wafer fragment shown at a second embodiment processing step subsequent to that of FIG. 5.

Referring to FIG. 11, a semiconductive material wafer fragment 50a is illustrated at a processing step subsequent to the step illustrated in FIG. 5. Wafer fragment 50a comprises a first conductive material 80a formed over a mass 62a and within an opening 70a. Conductive material 80a only partially fills opening 70a, and accordingly defines a void 86a therein. Mass 62a comprises layers 64a, 66a and 68a.

A masking material 82a is formed within void 86a and over mass 62a, and patterned to cover only a portion of conductive material 80a over mass 62a. Masking material 82a can comprise, for example, photoresist, and can be patterned by, for example, photolithographic processing.

Figure 12:
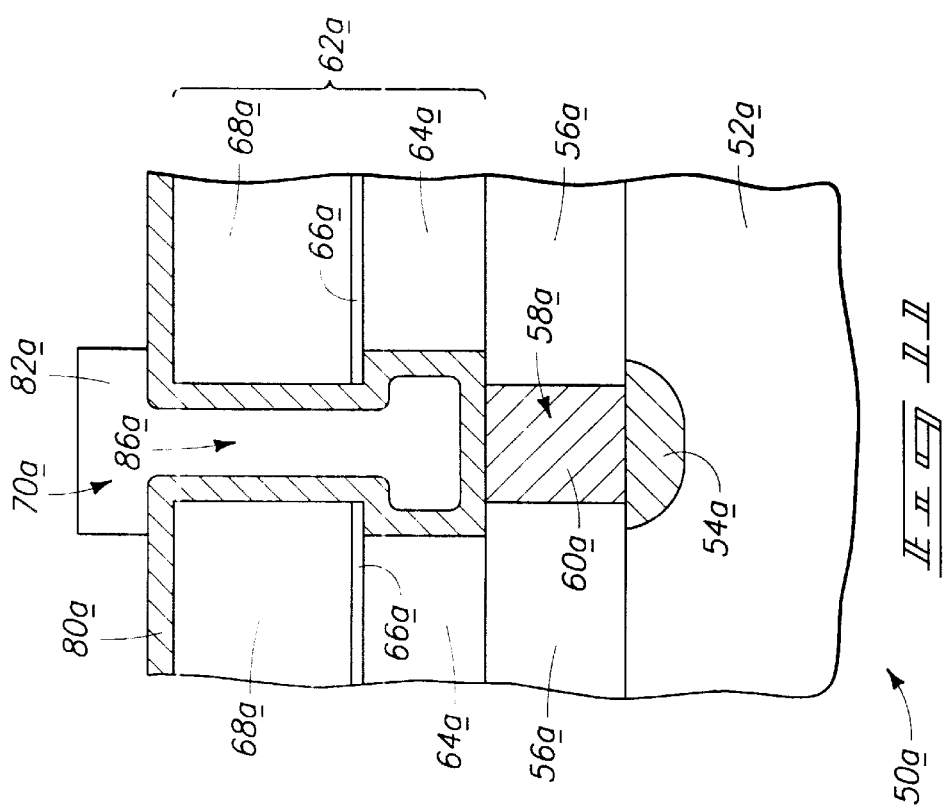
FIG. 12 is a view of the FIG. 3 wafer fragment shown at a processing step in accordance with the second embodiment and subsequent to that of FIG. 11.

Referring to FIG. 12, wafer fragment 50a is subjected to etching conditions which remove exposed portions of conductive material 80a from over mass 62a. Subsequently, masking material 82a (FIG. 11) is removed from within void 86a. In the shown embodiment, a portion of conductive material 80a remains over mass 62a. Such portion defines a flange 150. A top view of the construction of FIG. 12 is shown in FIG. 13. As can be seen in such top view, flange 150 extends around an upper periphery of a storage node defined by layer 80a.

Referring to FIG. 14, layer 68a (FIG. 12) is removed. Subsequently, a dielectric material 90a and a second conductive layer 92a are formed over storage node 80a and within void 86a to form a capacitor construction analogous to the construction described above with reference to FIG. 10.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor, comprising:

forming a mass over an electrical node;

forming an opening within the mass, the opening having a lower portion proximate the node and an upper portion above the lower portion, the lower portion being wider than the upper portion;

forming a first conductive layer within the opening and along a periphery of the opening;

after forming the first conductive layer, removing a portion of the mass from beside the upper portion of the opening while leaving an other portion of the mass beside the lower portion of the opening;

forming a dielectric material over the first conductive layer;

forming a second conductive layer over the dielectric material, the second conductive layer being separated from the first conductive layer by the dielectric material; and wherein the forming the first conductive material comprises:

depositing polysilicon within the opening and over the mass;

forming photoresist within the opening to protect the polysilicon within the opening;

exposing at least some of the polysilicon which is not within the opening to etching conditions to remove said at least some of the polysilicon; and ashing the photoresist to remove the photoresist from within the opening.

2. A method of forming a capacitor, comprising:

forming a first layer over an electrical node;

forming a second layer over the first layer;

forming an opening through the first and second layers;

after forming the opening, exposing the first and second layers to etching conditions which etch the first layer faster than the second layer, the exposing widening a lowest-most portion of the opening relative to an upper portion of the opening;

forming a first conductive layer within the opening;

after forming the first conductive layer, removing the second layer while leaving the first layer;

forming a dielectric material over the first conductive layer; and forming a second conductive layer over the dielectric material, the second conductive layer being separated from the first conductive layer by the dielectric material.

3. The method of claim 2 wherein the second layer consists essentially of an insulative material.

4. The method of claim 2 wherein the first layer consists essentially of a first material, and wherein the second layer consists essentially of a second material, the first material being selectively etchable relative to the second material.

5. The method of claim 4 wherein the first material is doped silicon dioxide and the second material is undoped silicon dioxide, and wherein the selectively etching comprises etching with HF.

6. The method of claim 4 wherein the first material is PSG and the second material is BPSG, and wherein the selectively etching comprises etching with HF.

7. The method of claim 2 wherein the first conductive layer comprises roughened polysilicon.

8. The method of claim 2 wherein the forming the first conductive layer comprises:
   depositing polysilicon within the opening and over the second layer; and
   removing at least some of the polysilicon from over the second layer.

9. A method of forming a capacitor, comprising:
   forming a first layer over an electrical node;
   forming a second layer over the first layer;
   forming an opening through the first and second layers;
   after forming the opening, exposing the first and second layers to etching conditions which etch the first layer faster than the second layer, the exposing widening a lower portion of the opening relative to an upper portion of the opening;
   forming a first conductive layer within the opening;
   after forming the first conductive layer, removing the second layer while leaving the first layer;
   forming a dielectric material over the first conductive layer;
   forming a second conductive layer over the dielectric material, the second conductive layer being separated from the first conductive layer by the dielectric material; and
   wherein the forming the first conductive layer comprises:
      depositing polysilicon within the opening and over the second layer;
      forming photoresist within the opening to protect the polysilicon within the opening;
      exposing at least some of the polysilicon which is not within the opening to
      etching conditions to remove said at least some of the polysilicon; and
      ashing the photoresist to remove the photoresist from within the opening.

10. A method of forming a capacitor, comprising:
   forming a first insulative layer over an electrical node;
   forming a second insulative layer over the first insulative layer;
   forming a third insulative layer over the second insulative layer;
   forming an opening through the first, second and third insulative layers;
   after forming the opening, exposing the first, second and third layers to etching conditions which etch the first insulative layer faster than the second and third layers, the exposing widening a lowest-most portion of the opening relative to an upper portion of the opening;
   forming a first conductive layer within the opening;
   after forming the first conductive layer, removing the third insulative layer while leaving the first and second insulative layers;
   forming a dielectric material over the first conductive layer; and
   forming a second conductive layer over the dielectric material, the second conductive layer being separated from the first conductive layer by the dielectric material.

11. The method of claim 10 wherein the first insulative layer consists essentially of a first material, the second insulative layer consists essentially of a second material, and the third insulative layer consists essentially of a third material, the first material being selectively etchable relative to the second material and third materials, the third material being selectively etchable relative to the second material.

12. The method of claim 11 wherein the first material is doped silicon dioxide, the second material is silicon nitride, and the third material is undoped silicon dioxide, wherein the selectively etching the first material relative to the second and third materials comprises etching with HF.

13. The method of claim 11 wherein the first material is PSG, the second material is silicon nitride, and the third material is BPSG, wherein the selectively etching the first material relative to the second and third materials comprises etching with HF.

14. The method of claim 11 wherein the first conductive layer comprises roughened polysilicon.

15. The method of claim 11 wherein the forming the first conductive layer comprises:
   depositing polysilicon within the opening and over the third insulative layer; and
   removing at least some of the polysilicon from over the third insulative layer.

16. A method of forming a capacitor, comprising:
   forming a first insulative layer over an electrical node;
   forming a second insulative layer over the first insulative layer;
   forming a third insulative layer over the second insulative layer;
   forming an opening through the first, second and third insulative layers;
   after forming the opening, exposing the first, second and third layers to etching conditions which etch the first insulative layer faster than the second and third layers, the exposing widening a lower portion of the opening relative to an upper portion of the opening;
   forming a first conductive layer within the opening;
   after forming the first conductive layer, removing the third insulative layer while leaving the first and second insulative layers;
   forming a dielectric material over the first conductive layer;
   forming a second conductive layer over the dielectric material, the second conductive layer being separated from the first conductive layer by the dielectric material; and
   wherein the forming the first conductive layer comprises:
      depositing polysilicon within the opening and over the third insulative layer;
      forming photoresist within the opening to protect the polysilicon within the opening;
      exposing at least some of the polysilicon which is not within the opening to etching conditions to remove said at least some of the polysilicon; and
      ashing the photoresist to remove the photoresist from within the opening.

* * * * *

UNITED STATES PATENT AND TRADEMARK OFFICE
CERTIFICATE OF CORRECTION

PATENT NO. : 6,429,087 B2
DATED : August 6, 2002
INVENTOR(S) : Siang Ping Kwok et al.

It is certified that error appears in the above-identified patent and that said Letters Patent is hereby corrected as shown below:

Column 3,
Line 66, replace "Is After" with -- After --.

Signed and Sealed this

Twenty-fifth Day of February, 2003

JAMES E. ROGAN
*Director of the United States Patent and Trademark Office*